(12) United States Patent
Kang

(10) Patent No.: US 9,281,373 B2
(45) Date of Patent: Mar. 8, 2016

(54) SEMICONDUCTOR DEVICE HAVING TUNGSTEN GATE ELECTRODE AND METHOD FOR FABRICATING THE SAME

(71) Applicant: SK hynix Inc., Gyeonggi-do (KR)

(72) Inventor: Dong-Kyun Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,506

(22) Filed: Dec. 18, 2012

(65) Prior Publication Data

US 2014/0061784 A1 Mar. 6, 2014

(30) Foreign Application Priority Data

Aug. 31, 2012 (KR) .......................... 10-2012-0096508

(51) Int. Cl.

| | |
|---|---|
| *H01L 29/49* | (2006.01) |
| *H01L 29/40* | (2006.01) |
| *H01L 21/28* | (2006.01) |
| *H01L 21/8238* | (2006.01) |
| *H01L 27/092* | (2006.01) |

(52) U.S. Cl.
CPC ...... *H01L 29/4966* (2013.01); *H01L 21/28088* (2013.01); *H01L 21/823842* (2013.01); *H01L 21/823857* (2013.01); *H01L 27/092* (2013.01); *H01L 29/401* (2013.01)

(58) Field of Classification Search
CPC .............. H01L 29/4966; H01L 29/401; H01L 21/8236; H01L 21/84
USPC .......... 257/334, 369, E21.672; 438/587, 183, 438/140
See application file for complete search history.

(56) References Cited

U.S. PATENT DOCUMENTS

| | | | | |
|---|---|---|---|---|
| 5,523,588 A | * | 6/1996 | Nishimura et al. | ............. 257/77 |
| 6,340,629 B1 | * | 1/2002 | Yeo et al. | ....................... 438/592 |
| 7,824,988 B2 | * | 11/2010 | Hoefler et al. | ................ 438/276 |

(Continued)

FOREIGN PATENT DOCUMENTS

| | | |
|---|---|---|
| KR | 1020010070961 | 7/2001 |
| KR | 100666917 | 1/2007 |
| KR | 1020090068187 | 6/2009 |
| KR | 1020110060738 | 6/2011 |

OTHER PUBLICATIONS

Burkov, "Influence of Carbon Content of WC—Co Electrode Materials on the Wear Resistance of Electrospark Coatins", J. Surf. Eng. Mat. and Adv Tech. 2012, 2, 65-70.*

*Primary Examiner* — Sheng Zhu
(74) *Attorney, Agent, or Firm* — IP&T Group LLP

(57) ABSTRACT

The present invention provides a semiconductor device in which the threshold voltage of NMOS and the threshold voltage of PMOS are independently controllable, and a method for fabricating the same. The method includes: forming a gate insulating film over an NMOS region and a PMOS region of a semiconductor substrate; forming a carbon-containing tungsten over the gate insulating film formed over one of the NMOS region and the PMOS region; forming a carbon-containing tungsten nitride over the gate insulating film formed over the other one of the PMOS region or the NMOS region; forming a tungsten film over the carbon-containing tungsten and the carbon-containing tungsten nitride; post-annealing the carbon-containing tungsten and the carbon-containing tungsten nitride; and etching the tungsten film, the carbon-containing tungsten, and the carbon-containing tungsten nitride, to form a gate electrode in the NMOS region and the PMOS region.

5 Claims, 13 Drawing Sheets

(56) References Cited

U.S. PATENT DOCUMENTS

| | | |
|---|---|---|
| 2004/0104439 A1 | 6/2004 | Haukka et al. |
| 2007/0128775 A1* | 6/2007 | Jeon et al. .................... 438/149 |
| 2011/0233778 A1 | 9/2011 | Lee et al. |
| 2011/0303960 A1* | 12/2011 | Cao et al. ...................... 257/315 |
| 2013/0062701 A1* | 3/2013 | Lee et al. ...................... 257/369 |
| 2013/0109172 A1* | 5/2013 | Collins et al. ................. 438/653 |
| 2013/0127058 A1* | 5/2013 | Lavoie et al. ................. 257/763 |

\* cited by examiner

SEMICONDUCTOR DEVICE HAVING TUNGSTEN GATE ELECTRODE AND METHOD FOR FABRICATING THE SAME

CROSS-REFERENCE TO RELATED APPLICATIONS

The present application claims priority of Korean Patent Application No. 10-2012-0096508, filed on Aug. 31, 2012, which is incorporated herein by reference in its entirety.

BACKGROUND

1. Field

Exemplary embodiments of the present invention relate to a semiconductor device, and more particularly, to a semiconductor device having a tungsten gate electrode and a method for fabricating the same.

2. Description of the Related Art

The requirements of next-generation CMOS circuits include low voltage, low power, high performance, high density and high reliability, which are achieved by the scaling of CMOS circuits. Scaling of the thickness of a gate insulating film results in various problems, including direct tunneling, impurity diffusion from a gate electrode, deterioration in the operating characteristics, reliability and lifetime of a gate, and so on. To achieve high capacitance, the thickness of the gate insulating film should be reduced, but in this case, leakage current increases to cause problems associated with the operating characteristics and reliability of the gate.

A physical limit to the thickness of the gate insulating film necessitates the introduction of new materials having high dielectric (high-k) characteristics. A high-k gate insulating film to which a large thickness can be physically applied can substitute for a silicon oxide film and can significantly reduce leakage current to improve the operating characteristics and reliability of the gate. The high-k gate insulating film should have a dielectric constant value higher than a silicon oxide film, thermodynamic stability in high-temperature thermal processes, and an amorphous phase.

When the high-k gate insulating film is introduced, it is difficult to use an N-type polysilicon film and a P-type polysilicon film as gate electrodes. This is because depletion is caused by impurity tunneling between an impurity-doped polysilicon film and a channel, and thus current decreases and charge trapping in an interfacial charge layer increases, resulting in an unstable increase in threshold voltage.

Thus, when a metal film is used as a gate electrode, additional impurity doping can be eliminated to reduce the number of processes, the gate depletion problem can be solved, and high-speed operation becomes possible by the introduction of a metal film having a very low resistance.

However, when a metal having a mid-gap work function is applied to both PMOS and NMOS, a very high threshold voltage should be applied to turn on each transistor, and thus the requirements of a low-voltage, high-efficiency device are not satisfied. Thus, in order to maintain the threshold voltage of a transistor at a low level to make the high-speed operation thereof possible, a double metal gate electrode structure is necessarily required.

SUMMARY

An exemplary embodiment of the present invention is directed to a semiconductor device in which the threshold voltage of NMOS and the threshold voltage of PMOS are independently controllable, and a method for fabricating the same.

In accordance with an exemplary embodiment, a semiconductor device may include: a substrate including an NMOS region and a PMOS region; a first gate electrode formed in one of the NMOS region or the PMOS region and comprising a first tungsten-containing film containing a first work function control material; and a second gate electrode formed in the other one of the NMOS region or the PMOS region and comprising a second tungsten-containing film containing a second work function control material that is different than the first work function control material.

In accordance an exemplary embodiment, a semiconductor device may include: a substrate including an NMOS region and a PMOS region; a first gate electrode formed in one of the NMOS region or the PMOS region, the first gate electrode comprising a stack of a carbon-containing tungsten film and a tungsten film; and a second gate electrode formed in the other one of the NMOS region or the PMOS region, the second gate electrode comprising a stack of a carbon containing tungsten nitride film and a tungsten film.

In accordance with an exemplary embodiment, a method for fabricating a semiconductor device may include: forming a gate insulating film over an NMOS region and a PMOS region of a semiconductor substrate; forming a first tungsten-containing film, containing a first work function control material, over the gate insulating film formed over one of the NMOS region or the PMOS region; forming a second tungsten-containing film, containing a second work function control material that is different than the first work function control material, over the gate insulating film formed over the other one of the PMOS region or the NMOS region; post-annealing the first tungsten-containing film and the second tungsten-containing film; and etching the first tungsten-containing film and the second tungsten-containing film to form a gate electrode in the NMOS region and the PMOS region.

In accordance with an exemplary embodiment, a method for fabricating a semiconductor device may include: forming a gate insulating film over an NMOS region and a PMOS region of a semiconductor substrate; forming a carbon-containing tungsten over the gate insulating film formed over one of the NMOS region or the PMOS region; forming a carbon-containing tungsten nitride over the gate insulating film formed over the other one of the PMOS region or the NMOS region; forming a tungsten film over the carbon-containing tungsten and the carbon-containing tungsten nitride; post-annealing the carbon-containing tungsten and the carbon-containing tungsten nitride; and etching the tungsten film, the carbon-containing tungsten, and the carbon-containing tungsten nitride, to form a gate electrode in the NMOS region and the PMOS region.

DETAILED DESCRIPTION

Figure 1:
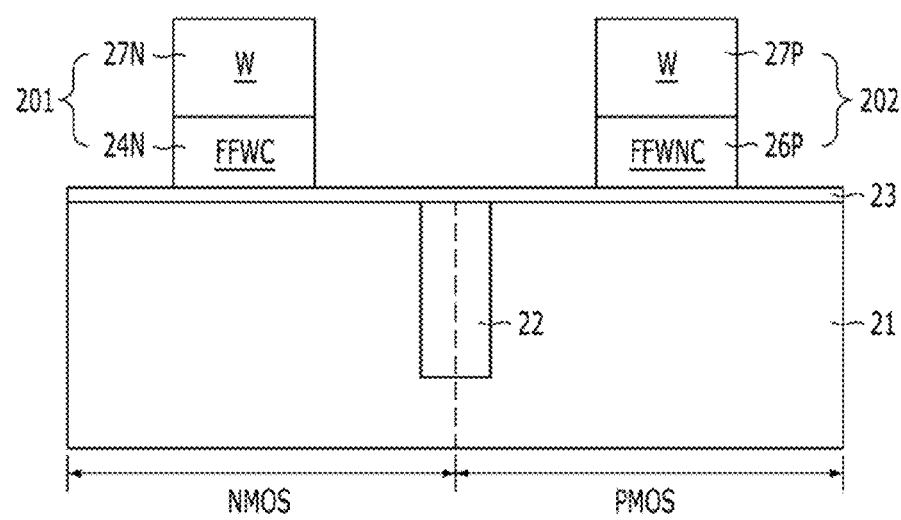
FIG. 1 is a cross-sectional view showing a gate structure according to an exemplary embodiment.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view showing a gate structure according to an exemplary embodiment.

Referring to FIG. 1, a semiconductor substrate 21 has a first region NMOS, a second region PMOS, and a device isolation region 22 for isolation between the first region NMOS and the second region PMOS. The device isolation region 22 has a trench structure and can be formed by a shallow trench isolation (STI) process. On the semiconductor substrate 21, a gate insulating film 23 is formed of a high dielectric material having a dielectric constant higher than that of general silicon oxide.

On the gate insulating film 23 in the first region NMOS, a first tungsten-containing gate electrode 201 is formed. The first tungsten-containing gate electrode 201 comprises a first tungsten-containing film pattern 24N and a third tungsten-containing film pattern 27N. The first tungsten-containing film pattern 24N contains a work function control material. The work function control material may include carbon. The first tungsten-containing film pattern 24N may include a carbon-containing tungsten ($W_{1-x}C_x$). The first tungsten-containing film pattern 24N may be formed to a thickness of about 20-30 Å. The carbon-containing tungsten has a low work function of about 4.5 eV or less. For example, about 4.2 eV to about −4.5 eV). This low work function is obtained by the carbon content (x) of the carbon-containing tungsten. To control the carbon content (x), a fluorine-free tungsten source containing carbon and hydrogen plasma treatment may be used. The carbon content (x) may be about 10-15 at % (atomic percent). As described below, the carbon content (x) is the content after annealing has been performed.

On the gate insulating film 23 in the second region PMOS, a second tungsten-containing gate electrode 202 is formed. The second tungsten-containing gate electrode 202 comprises a second tungsten-containing film pattern 26P and a third tungsten-containing film pattern 27P. The second tungsten-containing film pattern 26P may contain a work function control material. The work function control material may include carbon and nitrogen. For example, the second tungsten-containing film pattern 26P may include a tungsten containing carbon and nitrogen ($W_{1-x-y}N_xC_y$). The tungsten containing carbon and nitrogen ($W_{1-x-y}N_xC_y$) may be a carbon-containing tungsten nitride. The second tungsten-containing film pattern 26P may be formed to a thickness of about 20-30 Å. The carbon-containing tungsten nitride has a low work function of about 5.2 eV or less. For example, about 4.9 eV to about 5.2 eV). This low work function is obtained by the carbon content (y) and nitrogen content (x) of the carbon-containing tungsten. To control the carbon content (y) and nitrogen content (x) of the carbon-containing tungsten nitride, a fluorine-free tungsten source containing carbon and $NH_3$ plasma treatment may be used. The carbon content (y) may be about 5-10 at %. The nitrogen content (x) may be about 20-30 at %. As described below, the carbon content (y) and the nitrogen content (x) are the contents after annealing has been performed.

The third tungsten-containing films 27N and 27P contain tungsten (W). The third tungsten-containing film may comprise a bulk tungsten film or a stack of a tungsten nucleation film and a bulk tungsten film. The tungsten nucleation film may be formed to a thickness of about 10-20 Å. To obtain low resistivity, the bulk tungsten film may have an alpha-tungsten (α-W) phase. The bulk tungsten film has an alpha-tungsten (α-W) phase having a body-center cubic structure (BCC).

In FIG. 1, the first tungsten-containing film pattern 24N and the second tungsten-containing film pattern 26P can serve as diffusion barriers. The first tungsten-containing film pattern 24N may include a carbon-containing tungsten, and the second tungsten-containing film pattern 26P may include a carbon-containing tungsten nitride. The carbon-containing tungsten may include a fluorine-free tungsten containing carbon (FFWC). The carbon-containing tungsten nitride may include a fluorine-free tungsten nitride containing carbon (FFWNC).

Thus, the second tungsten-containing gate electrode 202 may be composed of a stack (W/FFWNC) of a fluorine-free tungsten nitride containing carbon (FFWNC), a tungsten nucleation film and a bulk tungsten film. In addition, the second tungsten-containing gate electrode 202 may be composed of a stack of a fluorine-free tungsten nitride containing carbon (FFWNC) and a bulk tungsten film. The first tungsten-containing gate electrode 201 may be composed of a stack (W/FFWC) of a fluorine-free tungsten containing carbon (FFWC), a tungsten nucleation film and a bulk tungsten film. In addition, the first tungsten-containing gate electrode 201 may be composed of a stack of a fluorine-free tungsten containing carbon (FFWC) and a bulk tungsten film.

As shown in FIG. 1, the NMOS region includes the first tungsten-containing gate electrode 201, and the PMOS region includes the second tungsten-containing gate electrode 202. The first tungsten-containing gate electrode 201 comprises the first tungsten-containing film pattern 24N having a work function suitable for the NMOS region. The second tungsten-containing gate electrode 202 comprises the second tungsten-containing film pattern 26P having a work function suitable for the PMOS region.

Thus, according to an exemplary embodiment, the threshold voltage of NMOS and the threshold voltage of PMOS can be independently controlled.

In addition, according to an exemplary embodiment, the tungsten-containing gate electrodes are formed of the fluoride-free tungsten containing carbon (FFWC) and the fluorine-free tungsten nitride containing carbon (FFWNC), and thus the their interfaces with the gate insulating film 23 have excellent characteristics. Also, because polysilicon or titanium nitride is not used, the polysilicon depletion ratio (PDR), Fermi-level pinning and resistance characteristics of the gate electrodes can be improved. Thus, a transistor capable of operating at a high speed can be formed.

Figure 2:
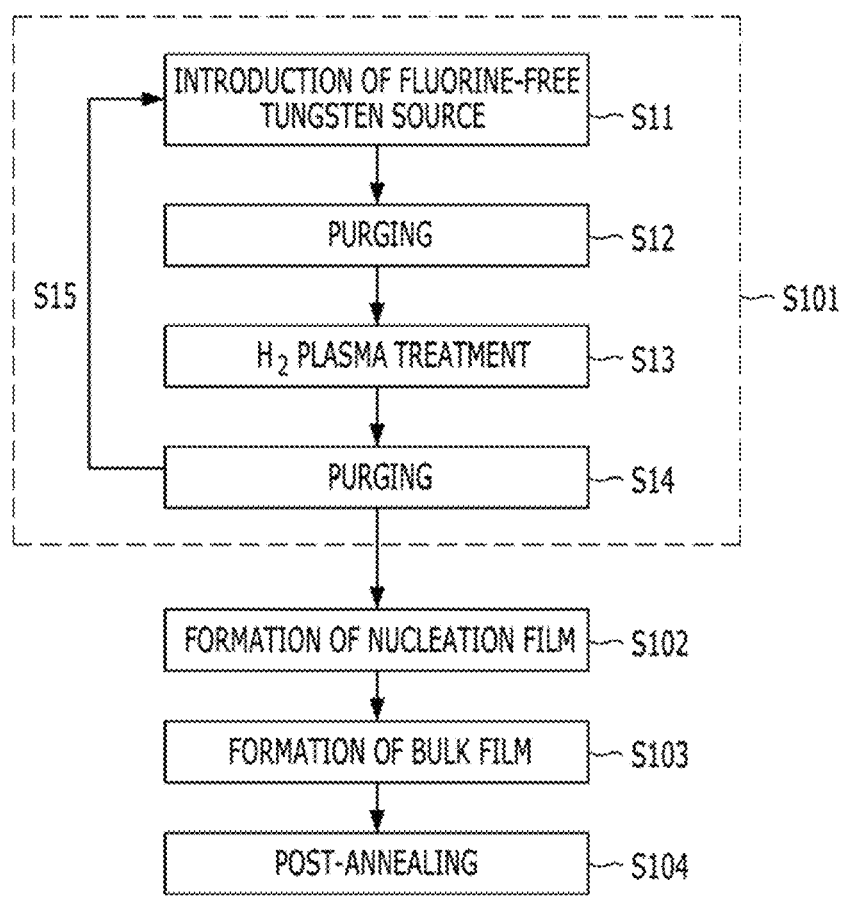
FIG. 2 shows a method for forming a first tungsten-containing gate electrode according to an exemplary embodiment.

FIG. 2 shows a method for forming a first tungsten-containing gate electrode according to an embodiment of the present invention. Hereinafter, the first tungsten-containing gate electrode will be referred to as a stack (W/FFWC) of a fluorine-free tungsten containing carbon (FFWC), a tungsten nucleation film and a bulk tungsten film.

Referring to FIG. 2, a method for forming a tungsten-containing film (W/FFWC) comprises forming a fluorine-free tungsten containing carbon (FFWC) at a step S101; forming a tungsten nucleation film at a step S102; forming a bulk tungsten film at a step S103; and post-annealing at a step S104.

At the Step S101, fluorine-free tungsten containing carbon (FFWC) is formed.

The fluorine-free tungsten containing carbon (FFWC) may be formed by atomic layer deposition (ALD). The atomic layer deposition (ALD) can be performed using a metal organic tungsten source. In the atomic layer deposition (ALD), the fluorine-free tungsten containing carbon (FFWC) can be deposited to a desired thickness by performing a unit cycle consisting of introducing a fluorine-free tungsten source at the step S11, performing purging operation at the step S12, introducing a reactant at the step S13, and performing a purging operation at the step S14, and repeating the unit cycle several times at the step S15. The atomic layer deposition may be carried out at a temperature of 150 to 320° C. and a power of 250 W.

At the step S11, the fluorine-free tungsten source (FFWS), based on a metal organic compound, is adsorbed onto a substrate. The substrate may be formed of any material (e.g., silicon) suitable for semiconductor processes and may comprise layers formed of dielectric or conductive materials thereon. As used herein, the term "substrate surface" refers to the surface of either any substrate on which the fluorine-free tungsten source (FFWS) is deposited or a material formed on the substrate. For example, the substrate surface may comprise silicon, silicon oxide, high dielectric materials, silicon nitride, doped silicon, metals, metal nitride, or other conductive materials.

The fluorine-free tungsten source (FFWS) that is used in the embodiment of the present invention may be a metal organic tungsten source. The fluorine-free tungsten source (FFWS) may include a metal organic tungsten source containing no fluorine. The fluorine-free tungsten source (FFWS) may include a compound containing tungsten and carbon. Also, the fluorine-free tungsten source (FFWS) may include a compound containing tungsten, carbon and nitrogen. Examples of the fluorine-free tungsten source (FFWS) may include, for example, $C_8H_7NO_3W$ (dicarbonyl (η5-methylcyclopentadienyl) nitrosyl tungsten) or $C_{12}H_{30}N_4W$ (bis(tert-butylimino) bis (dimethylamino)tungsten). A fluorine-free tungsten containing carbon (FFWC) deposited using the fluorine-free tungsten source (FFWS) may have decreased resistivity by the carbon content thereof and can function as a barrier. Thus, the flow rate of the fluorine-free tungsten source (FFWS) can be controlled such that the carbon content of the fluorine-free tungsten containing carbon (FFWC) is about 40 at % (atomic percent) or less.

At the step S12, the purging operation is carried out in order to remove a non-adsorbed fluorine-free tungsten source. The purging operation can be performed in the presence of inert gas such as argon.

The step S13 of introducing the reactant is carried out by reacting the reactant with the adsorbed fluorine-free tungsten source (FFWS) to deposit a fluorine-free tungsten containing carbon (FFWC) in an atomic layer unit. Herein, the reactant may include a reducing agent or reducing gas. The reactant may include a hydrogen-containing material. The step S13 of introducing the reactant may comprise treating a hydrogen-containing material with plasma. Step (S13) of introducing the reactant may comprise hydrogen ($H_2$) plasma treatment. When this hydrogen plasma treatment is carried out, the fluorine-free tungsten containing carbon (FFWC) is deposited by reaction of the fluorine-free tungsten source with hydrogen. The carbon content of the fluorine-free tungsten containing carbon (FFWC), which is deposited by hydrogen plasma treatment, can be controlled to about 40 at % or less. To control the carbon content, the conditions of hydrogen plasma treatment (e.g., a power of about 250 W) can be controlled. When hydrogen plasma treatment is carried out, impurities contained in the fluorine-free tungsten containing carbon (FFWC) can also be removed.

At the step S14, the purging operation is performed to remove any unreacted reactant or reaction byproducts. The step of purging may be carried out in the presence of inert gas such as argon.

The fluorine-free tungsten containing carbon (FFWC) may be formed to a desired thickness by repeating the unit cycle, comprising introducing a fluorine-free tungsten source at the step S11 performing a purging operation at the step S12, introducing a reactant at the step S13, performing a purging operation at the step S14, at the step S15, and repeating the unit cycle a number of times as required to achieve the desired thickness.

The fluorine-free tungsten containing carbon (FFWC) may be formed to a thickness of about 20-30 Å. Because atomic layer deposition is used, the film has good step coverage. The carbon content of the fluorine-free tungsten containing carbon (FFWC) may be about 25-35 at %. This carbon content is obtained based on the flow rate of the fluorine-free tungsten source and hydrogen plasma treatment.

The fluorine-free tungsten containing carbon (FFWC) is formed using a metal organic tungsten source containing no fluorine. Thus, the FFWC film contains no fluorine, and thus the surface of the underlying substrate is not deteriorated. Also, the content of carbon in the FFWC film can be controlled by hydrogen plasma treatment, Particularly, because the carbon content of the FFWC film is controlled to be about 40 at % or less, the FFWC film has decreased resistivity and functions as a diffusion barrier.

At the step S102, a tungsten nucleation film is formed on the fluorine-free tungsten containing carbon (FFWC). The tungsten nucleation film can be formed by atomic layer deposition (ALD) or chemical vapor deposition (CVD). When atomic layer deposition is used, it can be carried out in the same chamber as that in which the fluorine-free tungsten containing carbon (FFWC) is formed. The tungsten nucleation film can be formed using tungsten hexafluoride ($WF_6$) as a tungsten source and diborane ($B_2H_6$) as soaking gas. The tungsten nucleation film may be formed by introducing each of tungsten hexafluoride ($WF_6$) and diborane ($B_2H_6$) about 5-6 times, for example, followed by purging. Because diborane ($B_2H_6$) is used as soaking gas, the tungsten nucleation film has an amorphous phase. Thus, the tungsten nucleation film has large grains and low resistivity. The tungsten nucleation film is formed to a small thickness of about 20 Å or less. The flow rate of diborane ($B_2H_6$) is about 300 sccm or more, and the process temperature is about 350° C. or less. Because the tungsten nucleation film has an amorphous phase, a bulk tungsten film (which is formed in a subsequent process) can have a large grain size. The tungsten nucleation film is a thin tungsten layer acting as a site for the growth of a bulk tungsten film.

At the step S103, a bulk tungsten film is formed on the tungsten nucleation film. The bulk tungsten film can be formed using tungsten hexafluoride ($WF_5$) and hydrogen ($H_2$). The resistivity of the tungsten nucleation film is very high when compared to the resistivity of the bulk tungsten film. Thus, in order to obtain low resistivity, it would be preferable to omit the tungsten nucleation film if possible. However, if the bulk tungsten film is deposited directly on the fluorine-free tungsten containing carbon, the sheet resistance uniformity thereof will be reduced. For this reason, the tungsten nucleation film is formed as thin as possible. The bulk tungsten film can be deposited at a process temperature of about 400° C. or higher so as to have an alpha-tungsten (α-W) phase having a body-centered cubic structure of low resistivity. The bulk tungsten film can be formed by chemical vapor deposition or atomic layer deposition.

Accordingly, a tungsten-containing film having a stack comprising the fluorine-free tungsten containing carbon (FFWC), the tungsten nucleation film and the bulk tungsten film can be formed. Since the fluorine-free tungsten containing carbon (FFWC) is a diffusion barrier and the tungsten nucleation film and the bulk tungsten film are electrodes, the tungsten-containing film may be considered to be a stack of "W/FFWC". The fluorine-free tungsten containing carbon (FFWC) contains no fluorine, and the tungsten nucleation film and the bulk tungsten film contain no fluorine or can contain a very small amount of fluorine. Even if the tungsten nucleation film and the bulk tungsten film contain a very small amount of fluorine, the diffusion of fluorine to the substrate can be prevented, because the fluorine-free tungsten containing carbon (FFWC) functions as a diffusion barrier.

A fluorine-free tungsten source such as $C_8H_7NO_3W$ or $C_{12}H_{30}N_4W$ may also be used to form the tungsten nucleation film and the bulk tungsten film. However, the use of a fluorine-free tungsten source is disadvantageous in terms of resistivity, because the resultant film contains carbon.

At the step S104, after the tungsten-containing film comprising the fluorine-free tungsten containing carbon (FFWC), the tungsten nucleation film and the bulk tungsten film has been formed, post-annealing is carried out in order to reduce the resistivity of the film. The post-annealing may include rapid thermal processing (RIP). The post-annealing can be carried out for about 1 hour. The post-annealing can be carried out in a nitrogen ($N_2$) atmosphere in order to prevent the oxidation of the tungsten-containing film (W/FFWC). The post-annealing can be carried out at a temperature of about 800° C.

When the post-annealing is carried out, the grain size of the tungsten-containing film (W/FFWC) is increased using thermal energy. The tungsten-containing film undergoes a phase change so as to have a low coordination number. Also, the carbon concentration and resistivity thereof are reduced. Therefore, very small grains of the $W_2C$ phase and beta-tungsten (β-W) phase of the tungsten-containing film are changed to very large grains of an alpha-tungsten (α-W) phase by step (S38) of post-annealing.

For example, the carbon concentration of the tungsten-containing film (W/FFWC) is reduced to about 20 at % or less. For example, about 10-15 at %, by the post-annealing. The grain size of the film is increased by about 10 times or more. As a result, the tungsten-containing film (W/FFWC) subjected to post-annealing has a reduced carbon concentration and an increased grain size, and thus the resistivity thereof is reduced by about 80% or more compared to that before post-annealing.

Figure 3:
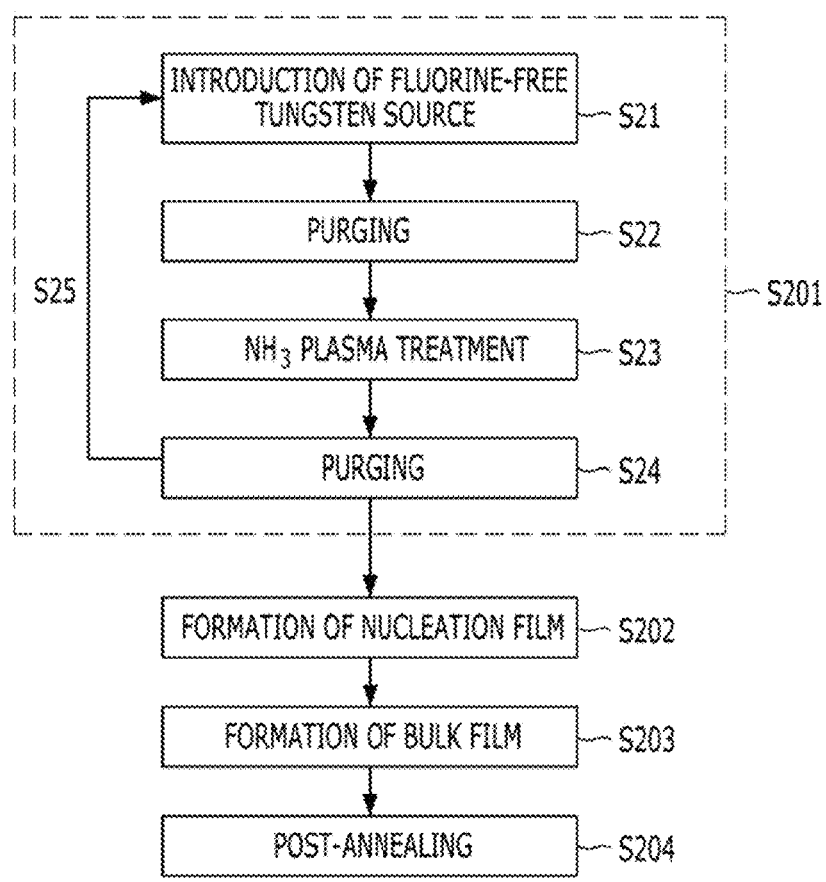
FIG. 3 shows a method for forming a second tungsten-containing gate electrode according to an exemplary embodiment

FIG. 3 shows a method for forming a second tungsten-containing gate electrode according to an exemplary embodiment. Hereinafter, the second tungsten-containing gate electrode will be referred to as a tungsten-containing film (W/FFWNC) composed of a stack of a fluorine-free tungsten nitride containing carbon (FFWNC), a tungsten nucleation film and a bulk tungsten film.

Referring to FIG. 3, a method for forming the tungsten-containing film (W/FFWNC) comprises forming a fluorine-free tungsten nitride containing carbon (FFWNC) at a step S201; forming a tungsten nucleation film at a step S202; forming a bulk tungsten film at a step S203; and performing post-annealing at a step S204.

At the Step S201 the fluorine-free tungsten nitride containing carbon (FFWNC) can be formed by atomic layer deposition (ALD). The atomic layer deposition (ALD) can be performed using a metal organic tungsten source. In the atomic layer deposition (ALD), the fluorine-free tungsten nitride containing carbon (FFWNC) may be deposited to a desired thickness by performing a unit cycle consisting of introducing a fluorine-free tungsten source at a step S21, performing a purging operation at a step S22, introducing a reactant at a step S23, and performing a purging operation at a step S24, and repeating the unit cycles several times at a step S25. The atomic layer deposition may be carried out at a temperature of about 150 to 320° C. and a power of about 250 W.

At the step S21, the fluorine-free tungsten source (FFWS) based on a metal organic compound is adsorbed onto a substrate. Herein, the substrate may be formed of any material (e.g., silicon) suitable for semiconductor processes and may comprise layers formed of dielectric or conductive materials thereon. As used herein, the term "substrate surface" refers to the surface of either any substrate on which the fluorine-free tungsten nitride containing carbon (FFWNC) is deposited or a material formed on the substrate. For example, the substrate surface may comprise silicon, silicon oxide, high dielectric materials, silicon nitride, doped silicon, metals, metal nitride, or other conductive materials.

The fluorine-free tungsten source (FFWS) that is used in an exemplary embodiment may be a metal organic tungsten source. The fluorine-free tungsten source (FFWS) may include a metal organic tungsten source containing no fluorine. The fluorine-free tungsten source (FFWS) may include a compound containing tungsten and carbon. Also, the fluorine-free tungsten source (FFWS) may include a compound containing tungsten, carbon and nitrogen. Examples of the fluorine-free tungsten source (FFWS) may include, for example, $C_8H_7NO_3W$ or $C_{12}H_{30}N_4W$. A fluorine-free tungsten nitride containing carbon (FFWNC) deposited using the fluorine-free tungsten source in (FFWS) may have decreased resistivity by the carbon content thereof and can function as a diffusion barrier. Thus, the flow rate of the fluorine-free tungsten source (FFWS) may be controlled such that the carbon content of the fluorine-free tungsten nitride containing carbon (FFWNC) is about 40 at % (atom percent) or less.

At the step S22, the purging operation is carried out in order to remove a non-adsorbed fluorine-free tungsten source. The step of purging can be performed in the presence of inert gas such as argon.

At the step S23 of introducing a reactant is carried out by reacting the reactant with the adsorbed fluorine-free tungsten source (FFWS) to deposit a fluorine-free tungsten nitride containing carbon (FFWNC) in an atomic layer unit. Herein, the reactant may include a reducing agent or reducing gas. The reactant may include a hydrogen-containing material. At the step S23, introducing the reactant may comprise treating a hydrogen-containing material with plasma. At the step S23, the introducing of the reactant may comprise $NH_3$ plasma treatment. When this $NH_3$ plasma treatment is carried out, the fluorine-free tungsten nitride containing carbon (FFWNC) is deposited. The carbon and nitrogen contents of the fluorine-free tungsten nitride containing carbon (FFWNC) may be controlled. To control the carbon and nitrogen contents, the condition of $NH_3$ plasma treatment (e.g., a power of about 250 W) may be controlled. When $NH_3$ plasma treatment is carried out, any impurity contained in the fluorine-free tungsten nitride containing carbon (FFWNC) can also be removed. As a result, the work function of the film may be controlled by controlling the conditions of $NH_3$ plasma treatment.

At the step S24, the purging operation is performed to remove any unreacted reactant or reaction byproducts. The step of purging may be carried out in the presence of inert gas such as argon, The fluorine-free tungsten nitride containing carbon (FFWNC) can be formed to a desired thickness by repeating the unit cycle, comprising step (S21) of introducing a fluorine-free tungsten source, step (S22) of purging, step (S23) of introducing a reactant, and (S24) of purging, at step (S25) a number of times as required to achieve the desired thickness. The fluorine-free tungsten nitride containing carbon (FFWNC) may be formed to a thickness of about 20-30 Å. Because atomic layer deposition is used, the film has good step coverage.

The fluorine-free tungsten nitride containing carbon (FFWNC) is formed using a metal organic tungsten source containing no fluorine. Thus, the FFWNC film contains no fluorine, and the surface of the underlying substrate is not deteriorated. Also, the content of carbon in the FFWNC film may be controlled by the $NH_3$ plasma treatment. Particularly, because the carbon content of the FFWNC film is controlled to be about 40 at % or less, the FFWNC film has decreased resistivity and functions as a diffusion barrier.

At the step 202, on the fluorine-free tungsten nitride containing carbon (FFWNC), a tungsten nucleation film is formed. The tungsten nucleation film can be formed by atomic layer deposition (ALD) or chemical vapor deposition (CVD). When atomic layer deposition is used, it may be carried out in the same chamber as that in which the fluorine-free tungsten nitride containing carbon (FFWNC) is formed.

The tungsten nucleation film may be formed using tungsten hexafluoride ($WF_6$) as a tungsten source and diborane ($B_2H_6$) as soaking gas. The tungsten nucleation film may be formed by introducing each of tungsten hexafluoride ($WF_6$) and diborane ($B_2H_6$) about 5-6 times, for example, followed by purging. Because diborane ($B_2H_6$) is used as soaking gas, the tungsten nucleation film has an amorphous phase. Thus, the tungsten nucleation film has large grains and low resistivity. The tungsten nucleation film is formed to a small thickness of about 20 Å or less. The flow rate of diborane ($B_2H_6$) is 300 sccm or more, and the process temperature is about 350° C. or below. Because the tungsten nucleation film has an amorphous phase, a bulk tungsten film which is formed in a subsequent process may have a large grain size. The tungsten nucleation film is a thin tungsten layer acting as a site for the growth of a bulk tungsten film.

At the step 203, a bulk tungsten film is formed on the tungsten nucleation film. The bulk tungsten film may be formed using tungsten hexafluoride ($WF_6$) and hydrogen ($H_2$). The resistivity of the tungsten nucleation film is very high when compared to a resistivity of the bulk tungsten film. Thus in order to obtain low resistivity, it would be preferable to omit the tungsten nucleation film, if possible. However, if the bulk tungsten film is deposited directly on the fluorine-free tungsten nitride containing carbon, the sheet resistance uniformity thereof will be reduced. For this reason, the tungsten nucleation film is formed as thin as possible. The bulk tungsten film can be deposited at a process temperature of about 400° C. or higher so as to have an alpha-tungsten ($\alpha$-W) phase having a body-centered cubic structure of low resistivity. The bulk tungsten film may be formed by chemical vapor deposition or atomic layer deposition.

Accordingly, a tungsten-containing film having a stack comprising the fluorine-free tungsten nitride containing carbon (FFWNC), the tungsten nucleation film and the bulk tungsten film may be formed. Since the fluorine-free tungsten nitride containing carbon (FFWNC) is a diffusion barrier and the tungsten nucleation film and the bulk tungsten film are electrodes, the tungsten-containing film may be considered to be a stack of "W/FFWNC". The fluorine-free tungsten nitride containing carbon (FFWNC) contains no fluorine, and the tungsten nucleation film and the bulk tungsten film contain no fluorine or can contain a very small amount of fluorine. Even if the tungsten nucleation film and the bulk tungsten film contain a very small amount of fluorine, the diffusion of fluorine to the substrate can be prevented, because the fluorine-free tungsten nitride containing carbon (FFWNC) functions as a diffusion barrier.

A fluorine-free tungsten source, such as $C_8H_7NO_3W$ or $C_{12}H_{30}N_4W$ may also be used to form the tungsten nucleation film and the bulk tungsten film. However, the use of a fluorine-free tungsten source is disadvantageous in terms of resistivity, because the film contains carbon.

At the step 204, after the tungsten-containing film (W/FFWNC), comprising the fluorine-free tungsten nitride containing carbon (FFWNC), the tungsten nucleation film and the bulk tungsten film, has been formed, post-annealing is carried out in order to reduce the resistivity of the film. The post-annealing may include rapid thermal processing (RTP). The post-annealing can be carried out for about 1 hour. The post-annealing can be carried out in a nitrogen ($N_2$) atmosphere in order to prevent the oxidation of the tungsten-containing film (W/FFWNC). The post-annealing can be carried out at a temperature of about 800° C.

When the post-annealing is carried out, the grain size of the tungsten-containing film (W/FFWNC) is increased using thermal energy. The tungsten-containing film undergoes a phase change so as to have a low coordination number. Also the carbon concentration and resistivity thereof are reduced. Grains of the tungsten-containing film are changed to very large grains of an alpha-tungsten ($\alpha$-W) phase by post-annealing.

For example, the carbon concentration of the tungsten-containing film (W/FFWNC) is reduced to about 10 at % or less. For example, about 5-10 at %, by post-annealing. The nitrogen content of the tungsten-containing film (W/FFWNC) is about 20-30 at %. The grain size of the film is increased by about 10 times or more. As a result, the tungsten-containing film (W/FFWNC), subjected to post-annealing has a reduced carbon concentration and an increased grain size. Thus, the resistivity thereof is reduced by about 80% or more compared to that before post-annealing.

Table 1 below shows changes in the resistivities of the tungsten-containing films (W/FFWC and W/FFWNC). In the tungsten-containing films (W/FFWC and W/FFWNC) each of FFWC and FFWNC has a thickness of 20 Å, and W has a thickness of 40 Å.

TABLE 1

| Conditions | Items | W/FFWC (40 Å/20 Å) | W/FFWNC (40 Å/20 Å) |
|---|---|---|---|
| As-deposited state | Resistivity | 143.4 μohm-cm | 243.2 μohm-cm |
| After post-annealing | Resistivity | 27.1 μohm-cm | 51.3 μohm-cm |

As can be seen in Table 1, the tungsten-containing film (W/FFWC) had a resistivity of about 143.4 μohm-cm, but the resistivity was reduced to 27.1 μohm-cm by post-annealing.

The tungsten-containing film (W/FFWNC) had a resistivity of about 243.2 μohm-cm, but the resistivity was reduced to 51.3 μohm-cm.

As described above, the resistivities of the tungsten-containing films (W/FFWC and W/FFWNC) were reduced by post-annealing by about 80% or more, as compared to the pre-post-annealing values.

Table 2 below shows the changes in the work functions of tungsten-containing films as a function of the carbon contents thereof. Samples of tungsten-containing films were prepared. A first sample [W/FFWC (40 Å/20 Å)], a second sample [W/FFWC (40 Å/20 Å)+ANL], a third sample [W/FFWC (30 Å/30 Å)], a fourth sample [W/FFWC (30 Å/30 Å)+ANL], a fifth sample (W/FFWNC1+ANL) and a sixth sample (W/FFWNC2+ANL) were prepared. In Table 2, the results for the first sample are those for as-deposited W/FFWC (40 Å/20 Å), and the results for the second sample (W/FFWC+ANL) are those for post-annealed W/FFWC (40 Å/20 Å). The results for the third sample are those for as-deposited W/FFWC (30 Å/30 Å), and the results for the fourth sample (W/FFWC+ANL) are those for post-annealed W/FFWC (30 Å/30 ÅA). The fifth sample (W/FFWNC1+ANL) had a high carbon content after post-annealing, and the sixth sample (W/FFWNC2+ANL) had a low carbon content after post-annealing.

TABLE 2

| Conditions | Work function | Carbon content |
|---|---|---|
| W/FFWC (40 Å/20 Å) | 4.46 | about 25-30 at % |
| W/FFWC (40 Å/20 Å) + ANL | 4.29 | about 10 at % |
| W/FFWC (30 Å/30 Å) | 4.54 | about 30-35 at % |
| W/FFWC (30 Å/30 Å) + ANL | 4.43 | about 15 at % |
| W/FFWNC1 + ANL | 4.92 | about 20 at % (40 at % in as-deposited state) |
| W/FFWNC2 + ANL | 5.01 | about 5-10 at % (20 at % in as-deposited state) |

As can be seen in Table 2 above, the tungsten-containing film (W/FFWC) comprising the fluorine-free tungsten containing carbon (FFWC) is maintained at a low carbon content of about 10-15 at % by post-annealing, and has a low work function of about 4.2-4.5 eV.

Also, the tungsten-containing film (W/FFWNC) comprising the fluorine-free tungsten nitride containing carbon (FFWNC) has a decreased carbon content as a result of post-annealing. For example, a carbon content of about 40 at % in the as-deposited state is decreased to about 20 at % after post-annealing. In addition, a carbon content of about 20 at % in the as-deposited state is decreased to about 5-10 at % after post-annealing.

It can be seen that the work function of the tungsten-containing film (W/FFWNC) comprising the fluorine-free tungsten nitride containing carbon (FFWNC) changes depending on the carbon content thereof. For example, when the film has a high carbon content of about 20 at % after post-annealing, it has a work function of about 4.92 eV, and when it has a low carbon content of about 5-10 at % after post-annealing, it has a high work function of about 5.01 eV. The work function of the fluorine-free tungsten nitride containing carbon (FFWNC) can depend not only on the carbon content, but also on the nitrogen content. The nitrogen content for obtaining the work function shown in Table 2 is about 20-30 at %.

As can be seen from the results in Table 2, the tungsten-containing film (W/FFWC) comprising the fluorine-free tungsten containing carbon (FFWC) can have a work function suitable for NMOS by controlling the carbon content through control of hydrogen plasma treatment conditions and carrying out of post-annealing.

The tungsten-containing film (W/FFWC) comprising the fluorine-free tungsten containing carbon (FFWC) can have a work function suitable for PMOS by controlling the carbon content through control of $NH_3$ plasma treatment conditions and carrying out of post-annealing.

Figure 4:
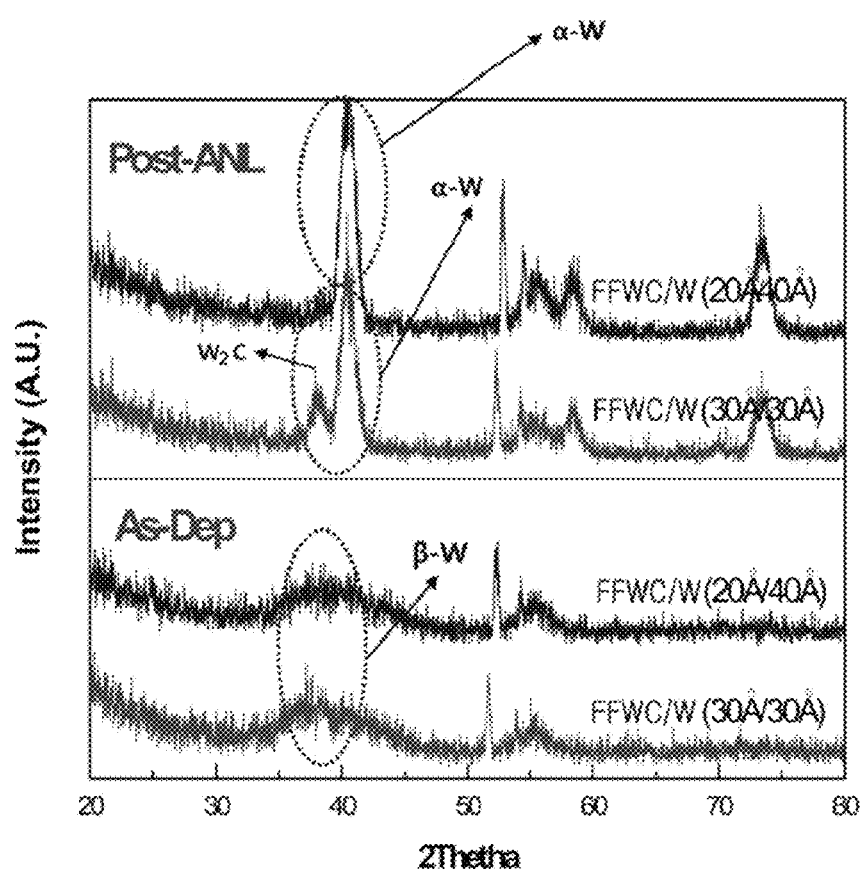
FIG. 4 illustrates the phase transition of a tungsten-containing film (W/FFWC) after post-annealing.

FIG. 4 illustrates the phase transition of the tungsten-containing film (W/FFWC) after post-annealing. FIG. 4 shows the results for W/FFWC (40 Å/20 Å) and W/FFWC (40 Å/30 Å).

As can be seen in FIG. 4, the crystalline phase in the as-deposited state (As-dep) is a beta phase (β-W), but is converted to an alpha phase (α-W) by post-annealing (Post-ANL). When the thickness of FFWC is about 30 Å, a weak $W_2C$ phase can appear, but in the case of W/FFWC (40 Å/30 Å), a strong alpha phase (α-W) appears, suggesting that the W/FFWC has an increased grain size.

Figure 5:
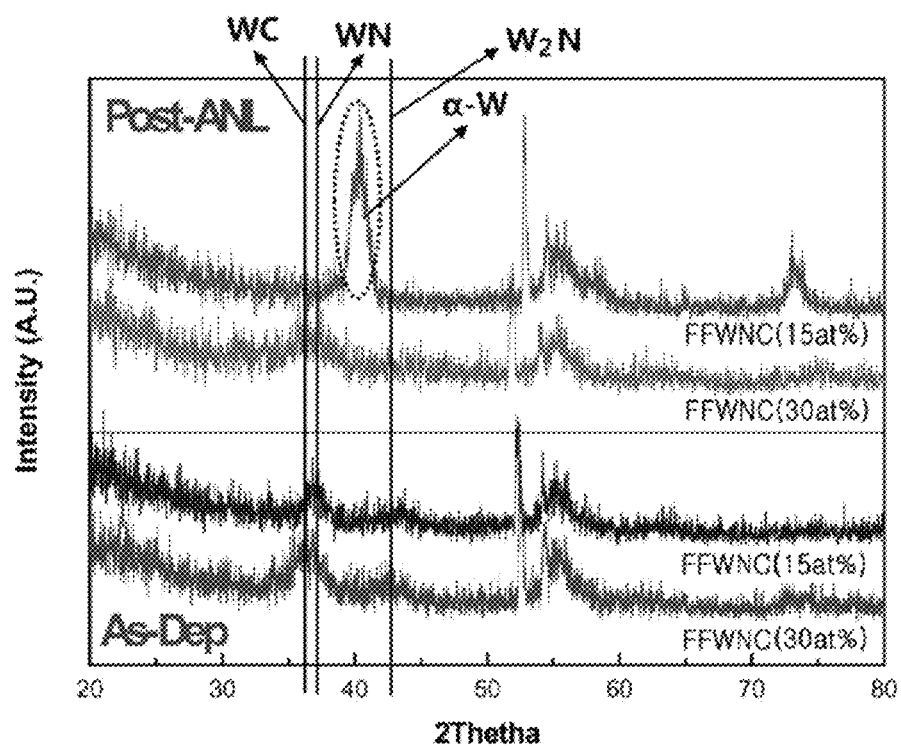
FIG. 5 illustrates the phase transition of a fluorine-free tungsten nitride containing carbon (FFWNC) after post-annealing.

FIG. 5 illustrates the phase transition of the fluorine-free tungsten nitride containing carbon (FFWNC) after post-annealing. FIG. 5 shows the results for FFWNC (15 at %) and FFWNC (30 at %). 15 at % and 30 at % are carbon contents.

As can be seen in FIG. 5, the fluorine-free tungsten nitride containing carbon (FFWNC) converted to an alpha phase (α-W) by performing post-annealing (Post-ANL). A WC phase, a WN phase and a W2N phase are not substantially observed.

When the carbon content is about 30 at %, the alpha phase (α-W) is not observed, but the carbon content is about 15 at %, the alpha phase (α-W) is strongly observed.

Figure 6:
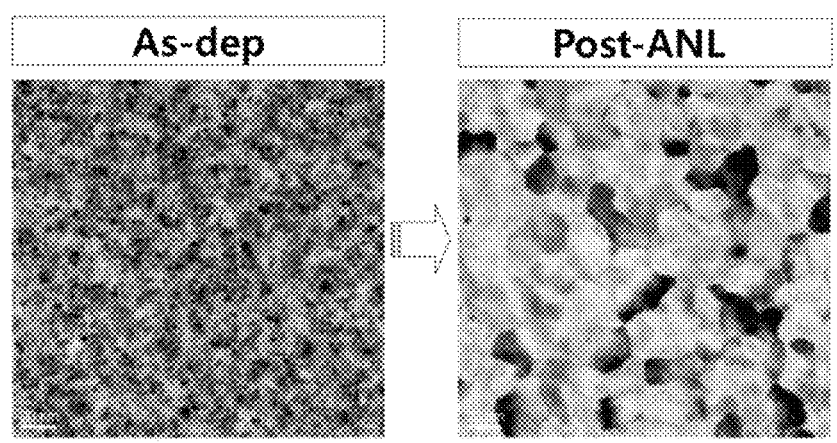
FIG. 6 illustrates grain size after post-heat treatment of W/FFWC.

FIG. 6 illustrates the grain size of W/FFWC after post-annealing. As can be seen therein, the grain size is increased by performing post-annealing (Post-ANL) compared to that of the as-deposited state (As-dep).

Figure 7:
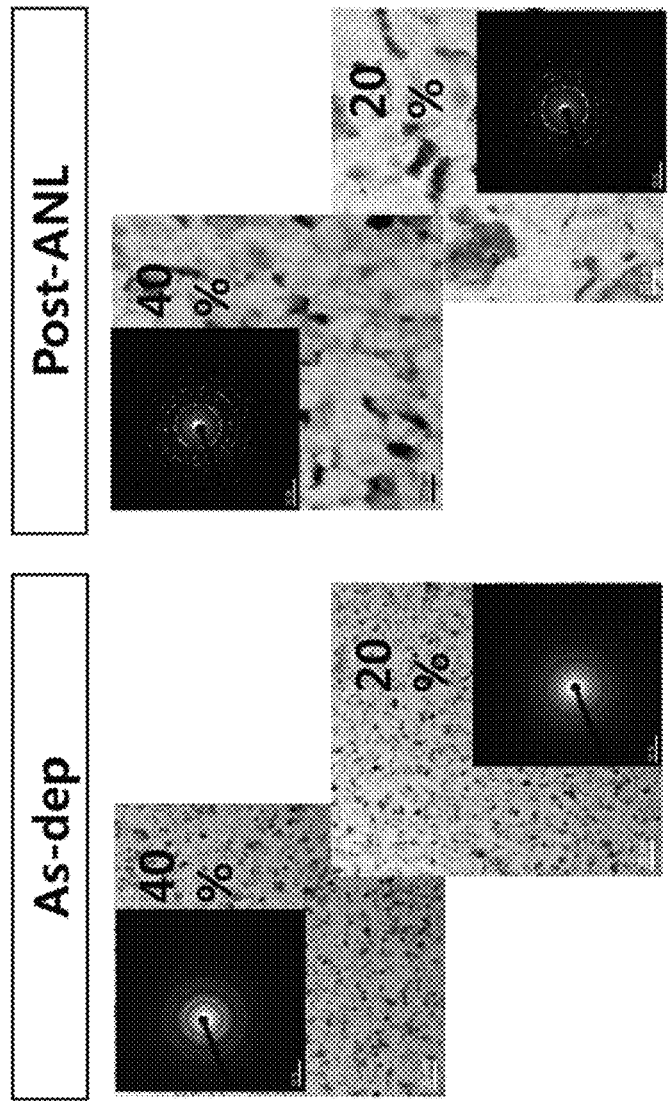
FIG. 7 illustrates the grain size of W/FFWC after an exemplary post-annealing.

FIG. 7 illustrates the grain size of W/FFWNC after post-annealing. As can be seen therein, the grain size is increased by performing post-annealing (Post-ANL) compared to that of the as-deposited state (As-dep). At carbon contents of about 40 at % and about 20 at %, the grain size increases. Meanwhile, it can be seen that, when the carbon content is as low as about 20 at %, the grain size further increases.

Figure 8:
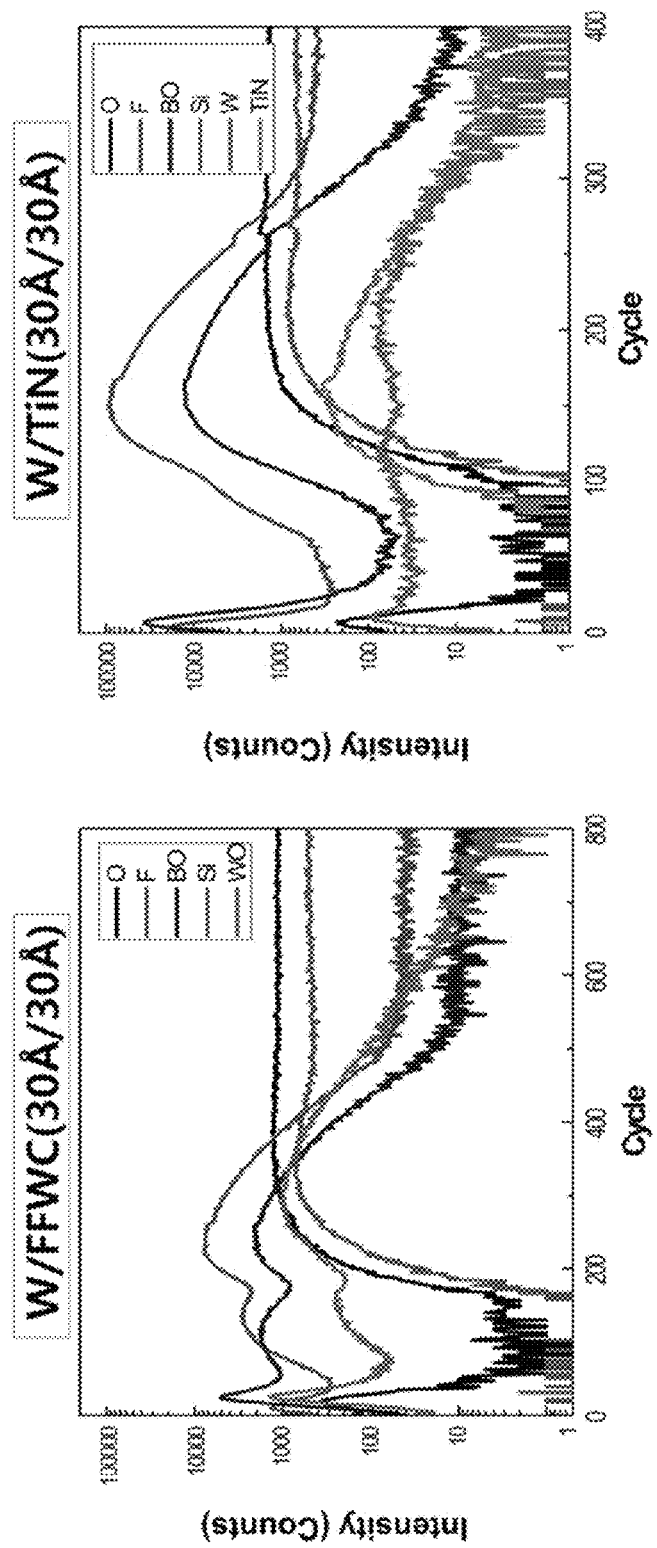
FIG. 8 illustrates the fluorine-diffusion barrier function of an exemplary fluorine-free tungsten containing carbon (FFWC).

FIG. 8 illustrates the fluorine-diffusion barrier function of the fluorine-free tungsten containing carbon (FFWC).

The results in FIG. 8 show a comparison of fluorine-diffusion barrier function between W/FFWC comprising the fluorine-free tungsten containing carbon (FFWC) as a barrier and W/TIN comprising titanium nitride (TiN) as a barrier. Each of the fluorine-free tungsten (FFW) and the titanium nitride (TiN) has a thickness of about 30 Å, and the tungsten layer has a thickness of about 30 Å.

As can be seen in FIG. 8, the peak of fluorine (F) in W/FFWC is lower than that in W/TiN, suggesting that the fluorine diffusion-preventing effect of the fluorine-free tungsten containing carbon (FFWC) is greater than that of the titanium nitride (TiN).

This fluorine diffusion-preventing effect can also be exhibited in W/FFWNC, and the fluorine diffusion-preventing effect of W/FFWNC is greater than that of W/TiN.

Figure 9:
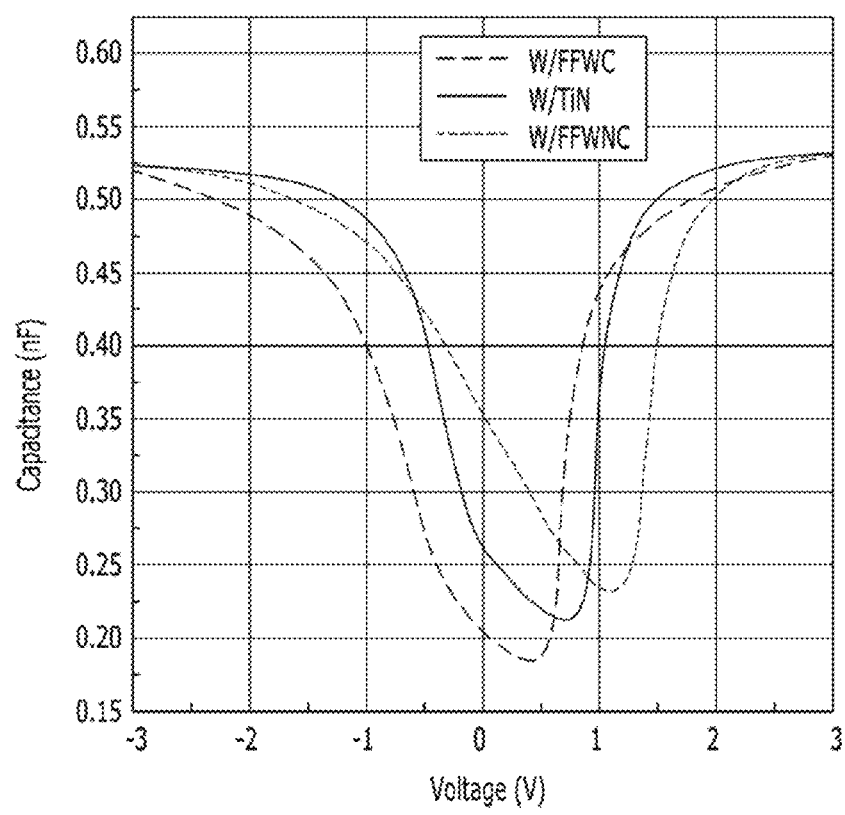
FIG. 9 illustrates the C-V characteristics of various materials which are used for gate electrodes.

FIG. 9 illustrates the C-V characteristics of various materials which are used for gate electrodes. The results in FIG. 9 show a comparison between W/FFWC, W/TiN, and W/FFWNC. W/FFWC, W/TiN, and W/FFWNC were all post-annealed.

As can be seen in FIG. 9, when the fluorine-free tungsten containing carbon (FFWC) is used, the threshold voltage (Vt) of the gate electrode can be changed to the same level as that of TiN and in the minus (−) direction.

Also, it can be seen that, when the fluorine-free tungsten nitride containing carbon (FFWNC) is used, the threshold voltage (Vt) of the gate electrode can be changed to the same level as that of TiN and in the plus (+) direction.

Figure 10:
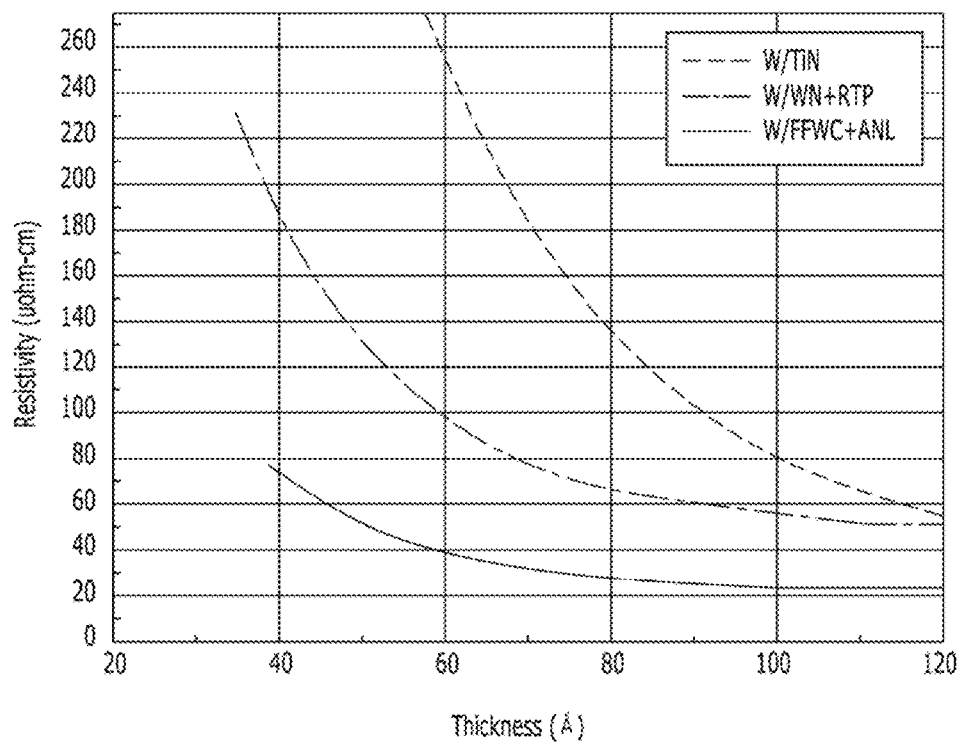
FIG. 10 shows a comparison between the resistivities of materials which are used for gate electrodes.

FIG. 10 shows a comparison between the resistivities of materials that may be used for gate electrodes.

FIG. 10 shows a comparison between a first sample (W/TiN) comprising a stack of titanium nitride and tungsten, a second sample (W/WN) comprising a stack of tungsten nitride and tungsten, and a third sample (W/FFWC) comprising fluorine-free tungsten containing carbon (FFWC) and tungsten. The second sample (W/WN) was annealed by RTP before deposition of tungsten, and the third sample was annealed after deposition of fluorine-free tungsten containing carbon (FFWC) and tungsten. Tungsten in each of the first, second and third samples is used as a gate electrode, and each of titanium nitride (TiN), tungsten nitride (WN) and fluorine-free tungsten containing carbon (FFWC) is used as a tungsten diffusion barrier.

As can be seen in FIG. 10, the resistivity of the third sample (W/FFWC) comprising fluorine-free tungsten containing carbon (FFWC) as a diffusion barrier is significantly lower than those of the first sample (W/TiN) and the second sample (W/WN).

For example, if the second sample and the third sample each has a thickness of about 60 Å, then the resistivity of the second sample is about 100 μohm-cm, but the resistivity of the third sample is about 40 μohm-cm. The first sample has a very high resistivity of about 240 μohm-cm.

As can be seen in Table 2 above, the resistivity of W/FFWNC comprising the fluorine-free tungsten nitride containing carbon (FFWNC) as a diffusion barrier is significantly lower than those of the first sample (W/TiN) and the second sample (W/WN).

As described above, according to an exemplary embodiment in which the fluorine-free tungsten containing carbon (FFWC) and the fluorine-free tungsten containing nitride carbon (FFWNC) are used as diffusion barriers, tungsten gate electrodes having resistivities lower than those of tungsten gate electrodes comprising tungsten nitride and titanium nitride as barriers be formed.

FIGS. 11A to 11F show an example of a method for forming a gate structure according to an exemplary embodiment. A method for fabricating a CMOS circuit will be described. However, the scope of the present invention is not limited to a CMOS circuit. The present invention is applicable to all semiconductor fabrication methods in which NMOS and PMOS are formed. In addition the present invention is applicable to each of an NMOS fabrication method and a PMOS fabrication method. NMOS and PMOS are formed in a CMOS circuit. The CMOS circuit includes at least one PMOS and at least one NMOS.

Figure 11A:
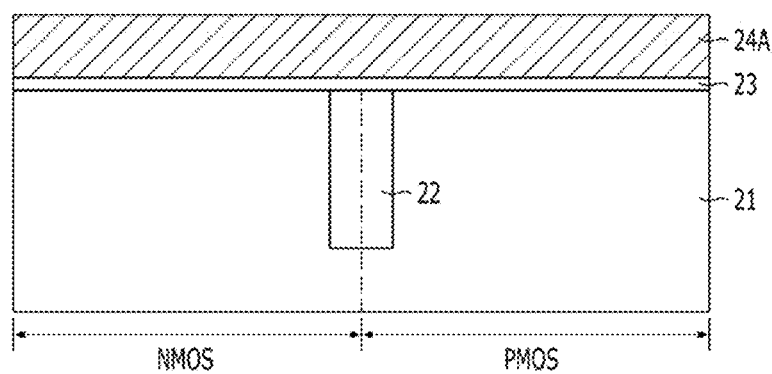
FIGS. 11A to 11F show an example of a method for forming a gate structure according to an exemplary embodiment.

As shown in FIG. 11A, a semiconductor substrate 21 has a first region NMOS, a second region PMOS, and a device isolation region for isolation between the first region NMOS and the second region PMOS. The device isolation region 22 has a trench structure and can be formed by a shallow trench isolation (STI) process. The device isolation region 22 may include an insulting film (e.g., a silicon oxide film). The first region NMOS is a region in which NMOS is formed, and the second region PMOS is a region in which PMOS is formed. The locations of the first region NMOS and the second region PMOS are for convenience of description and may also be changed with each other. Examples of the semiconductor substrate 21 include, but are not limited to, those composed of silicon, germanium, or silicon germanium. In addition, all or part of the semiconductor substrate 21 may be strained. The device isolation region 22 may include an insulating film (e.g., a silicon oxide film). Although not shown in the drawings, a first well and a second well may be formed in the first region NMOS and the second well PMOS, respectively, by a conventional process for forming wells. In the first region NMOS, a P-type first well may be formed, and in the second region PMOS, an N-type second well may be formed. To form the N-type second well, an N-type impurity, such as phosphorus (P) or arsenic (As) can be implanted into the second region PMOS of the substrate 101. To form the P-type first well, a P-type impurity, such as boron (B), can be implanted into the first region NMOS of the substrate 101, Although not shown in the drawings, a channel region may be formed in each of the first region NMOS and the second region PMOS by a conventional channel ion implantation process after the well formation process.

Then, a gate insulating film 23 is formed on the semiconductor substrate 21. The gate insulating film 23 at least includes a high dielectric (high-k) film. In addition, an interfacial layer (not shown) may be formed between the semiconductor substrate 21 and the gate insulating film 23. The structure of the gate insulating film 23 is the same between the first region NMOS and the second region PMOS. In other words, the portions of the gate insulating film 23 in NMOS and PMOS are formed of the same material.

An example of a method for forming the gate insulating film 23 is as follows.

First, native oxide is removed from the surface of the semiconductor substrate 21 by a cleaning process. The cleaning process is carried out using a solution containing hydrofluoric acid (HF). When the cleaning process is carried out, native oxide is removed from the surface of the semiconductor substrate 21, and at the same time, dangling bonds on the surface of the semiconductor substrate 21 are passivated with hydrogen so that the growth of native oxide is suppressed until a subsequent process is carried out.

Then, an interfacial layer is formed. The interfacial film includes an insulating material, for example, silicon oxide ($SiO_2$). The interfacial layer functions to improve the characteristics of the interface between the semiconductor substrate 21 and the gate insulating film 23, thereby improving electron mobility. As the interfacial film, silicon oxide can be grown by a wet process. The interfacial layer is grown to a thickness of about 10 Å or less.

Then, a gate insulating film 23 is formed. The gate insulating film 23 includes a high dielectric (high-k) material (hereinafter referred to as a "high dielectric film"). The high dielectric film has a dielectric constant which is significantly higher than that of silicon oxide ($SiO_2$) (about 3.9). Also, the high dielectric film is significantly thicker than silicon oxide and has a lower equivalent oxide thickness (EOT) value. For example, the high dielectric film includes a metal-containing material, such as a metal oxide, a metal silicate, or a metal silicate nitride. The metal oxide includes an oxide containing a metal, such as hafnium (Hf), aluminum (Al) lanthanum (La), or zirconium (Zr). The metal oxide may include hafnium oxide ($HfO_2$), aluminum oxide ($Al_2O_3$), lanthanum oxide ($LaO_2$), or zirconium oxide ($ZrO_2$). The metal silicate includes a silicate containing a metal, such as hafnium (Hf) or zirconium (Zr). The metal silicate may include, for example, hafnium silicate (HfSiO) or zirconium silicate ($ZrSiO_x$). Examples of the metal silicate nitride include, for example, hafnium silicate nitride (HfSiON) or zirconium silicate nitride (ZrSiON). When the gate insulating film 23 is formed of a metal silicate nitride, the dielectric constant thereof can be increased and the crystallization thereof in subsequent processes can also be suppressed. Because the high dielectric film is used in both NMOS and PMOS, the process is simplified. Meanwhile, different high dielectric films may also be used in NMOS and PMOS. The process for forming the high dielectric film may include deposition technology suitable for the material to be deposited. Examples of this deposition technology include chemical vapor deposition (CVD), low-pressure CVD (LPCVD), plasma-enhanced CVD (PECVD), metal-organic CVD (MOCVD), atomic layer deposition (ALD), plasma-enhanced ALD (PEALD) and the like. For formation of a uniform thin film, plasma-enhanced ALD (PEALD) can be used.

On the gate-insulating film 23, a first tungsten-containing film 24A is formed. The first tungsten-containing film 24A may contain a first work function control material. The first work function control material may include carbon. For example, the first tungsten-containing film 24A may include a fluorine-free tungsten containing carbon (FFWC). The first tungsten-containing film 24A can be formed to a thickness of about 20-30 Å. For a method for forming the fluorine-free tungsten containing carbon (FFWC) serving as the first tungsten-containing film 24A, reference is made to FIG. 2 and the description thereof.

Figure 11B:
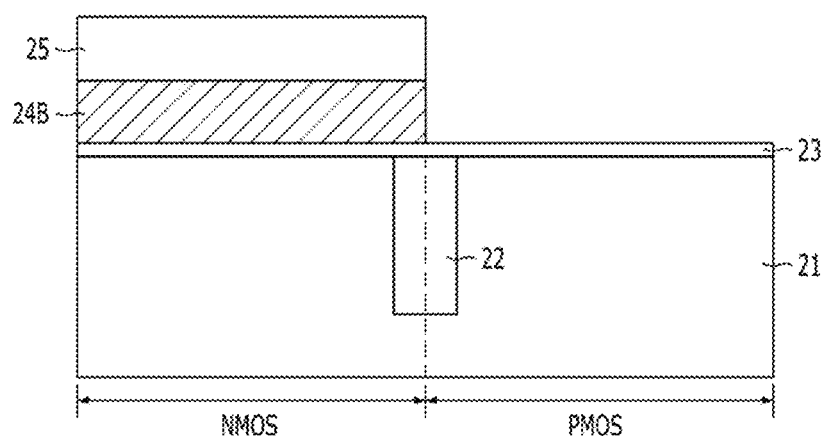

As shown in FIG. 11B, a first mask pattern 25 is formed on the first tungsten-containing film 24A such that it covers the first region NMOS and opens the second region PMOS. The first mask pattern 25 may be formed of photoresist.

Using the first mask pattern 25 as an etch mask, the first tungsten-containing film 24A is etched. Thus, in the first region NMOS, a first tungsten-containing film pattern 24B is formed, and in the second region PMOS, the first tungsten-containing film does not remain.

Figure 11C:
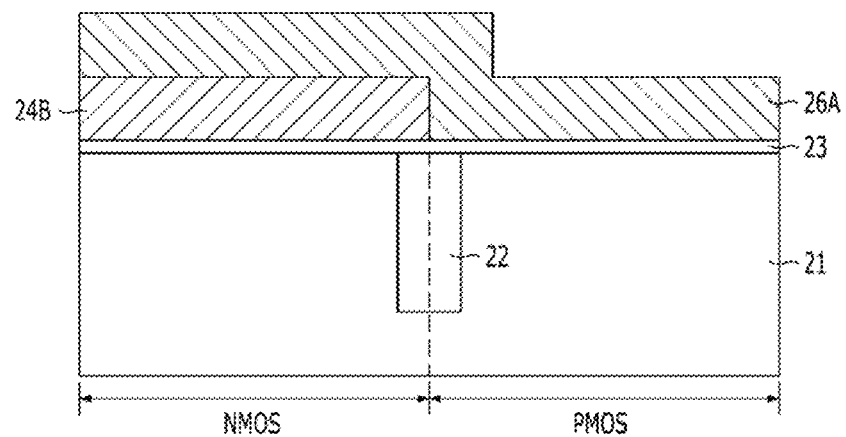

As shown in FIG. 11C, the first mask pattern 25 is removed, and then a second tungsten-containing film 26A is formed on the entire surface including the first tungsten-containing film pattern 24B. The second tungsten-containing film 26A may contain a second work function control material. The second work function control material may include carbon and nitrogen. For example, the second tungsten-containing film 26A may include a fluorine-free tungsten nitride containing carbon (FFWNC). The second tungsten-containing film 26A can be formed to a thickness of about 20-30 Å. For a method for forming the fluorine-free tungsten nitride containing carbon (FFWNC) serving as the second tungsten-containing film 26A, reference is made to FIG. 3 and the description thereof.

Figure 11D:
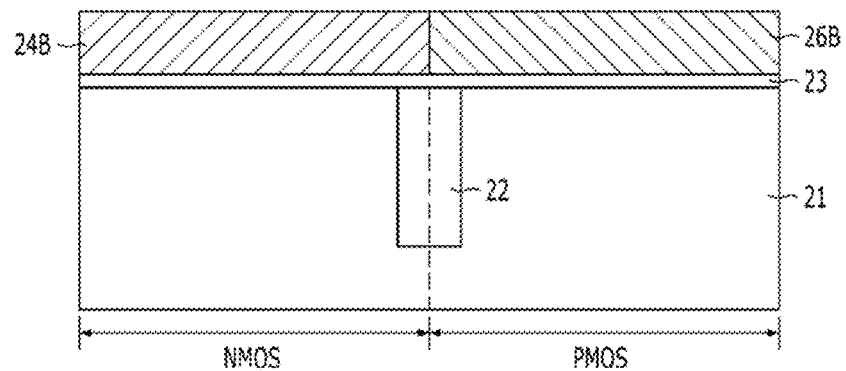

As shown in FIG. 11D, the second tungsten-containing film 26A is planarized. Thus, a second tungsten-containing film pattern 26B is formed in the second region PMOS. In the first region NMOS, the first tungsten-containing film pattern 24B remains.

Figure 11E:
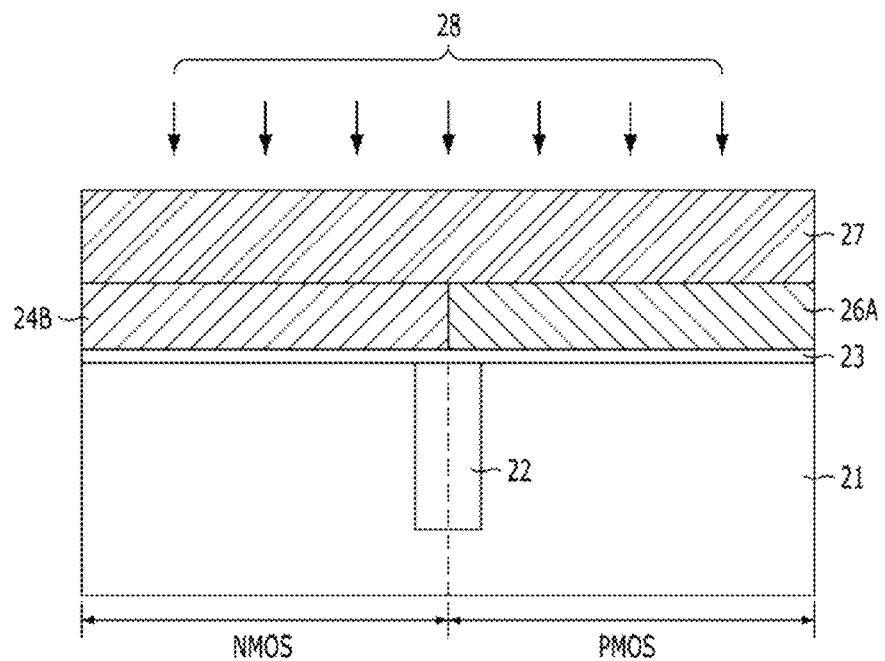

As shown in FIG. 11E, a third tungsten-containing film 27 may be formed on the first tungsten-containing film pattern 24B and the second tungsten-containing film 26B in order to reduce the resistance of the gate electrode. The third tungsten-containing film 27 may include a tungsten film. The third tungsten-containing film 27 may include a tungsten nucleation film and a bulk tungsten film. For example, the bulk tungsten film may be formed after formation of the tungsten nucleation film.

For formation of the third tungsten-containing film 27, reference is made to the methods for forming the tungsten nucleation film and the bulk tungsten film as described above with reference to FIGS. 2 and 3.

When the third tungsten-containing film 27 is formed as described above, a tungsten-containing material composed of a stack of the first tungsten-containing film pattern 24B and the third tungsten-containing film 27 is formed in the first region NMOS. In the second region PMOS, a tungsten-containing material composed of a stack of the second tungsten-containing film pattern 26B and the third tungsten-containing film 27 is formed. The tungsten-containing materials, which are formed in the first region NMOS and the second region PMOS, may contain different work function control materials. The tungsten-containing material, which is formed in the first region NMOS, may include carbon as a work function control material. The tungsten-containing material which is formed in the second region PMOS may include carbon and nitrogen as work function control materials.

After the third tungsten-containing film 27 has been formed as described above, post-annealing 28 is performed. For the post-annealing 28, reference is made to the post annealing step described above with reference to FIGS. 2 and 3.

As a result, the first tungsten-containing film pattern 24B, the second tungsten-containing film pattern 26B and third tungsten-containing film 27, which were subjected to the post-annealing 28, has a decreased carbon concentration and an increased grain size, and thus the resistivities thereof are decreased by about 80% or more compared to those of the as-deposited states.

Figure 11F:
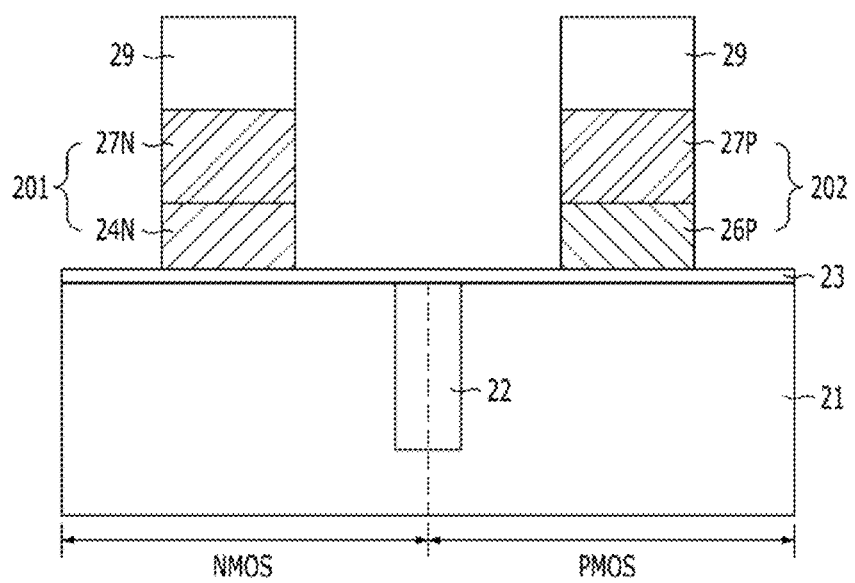

As shown in FIG. 11F, a second mask pattern 29 is formed on the third tungsten-containing film 27. The second mask pattern 29 may be formed of photoresist. The second mask pattern 29 can be a mask pattern for patterning the gate electrode of NMOS and the gate electrode of PMOS. The second mask pattern 29 may also include a hard mask film pattern formed using a photoresist pattern.

Using the second mask pattern 29 as an etch mask, the third tungsten-containing film 27, the first tungsten-containing film pattern 24B and the second tungsten-containing film pattern 26B are etched. Thus, in the first region NMOS, a first tungsten-containing gate electrode 201 is formed, and in the second region PMOS, a second tungsten-containing gate electrode 202 is formed. The first tungsten-containing gate electrode 201 includes the first tungsten-containing film pattern 24N and the third tungsten-containing film pattern 27N. The second tungsten-containing gate electrode 202 includes the second tungsten-containing film pattern 26P and the third tungsten-containing film pattern 27P.

Although not shown in the drawings, a gate spacer may be formed on the sidewall of each of the first and second tungsten-containing gate electrodes 201 and 202. Then, source/drain regions can be formed by ion-implanting an impurity.

According to an exemplary embodiment, the gate electrode in NMOS comprises the first tungsten-containing film pattern 24N containing a work function control material. The gate electrode in PMOS comprises the second tungsten-containing film pattern 26P containing a work function control material. In addition, the gate electrode in NMOS and the gate electrode in PMOS further comprise the third tungsten-containing film patterns 27N and 27P, respectively, which are materials for reducing the resistance of the gate electrodes.

Thus, it is possible to independently control each of the threshold voltages of NMOS and PMOS in CMOS circuit processes.

Specifically, the gate electrode in PMOS comprises the fluorine-free tungsten nitride containing carbon (FFWNC) having a high work function of about 4.8 eV or more, and thus has an increased threshold voltage.

In addition, the gate electrode in NMOS comprises the fluorine-free tungsten containing carbon (FFWC) having a low work function of about 4.5 eV or less, and thus has a decreased threshold voltage.

In an exemplary embodiment, the tungsten-containing gate electrodes containing work function control materials can be planar gate electrodes. In an exemplary embodiment, the tungsten-containing work function control materials can be applied to recess gate electrodes, buried gate electrodes or vertical gate electrodes. In addition, the tungsten-containing work function control materials can also be applied to bit lines. Further, the tungsten-containing work function control materials can also be applied to tungsten plugs.

As described above, a tungsten-containing film containing a work function control material is used as a gate electrode in each of NMOS and PMOS, and a double metal gate electrode structure can be formed which has not only a work function suitable for each transistor, but also has low resistance.

In addition, tungsten-containing gate electrodes are formed of fluorine-free tungsten. Thus their interfaces with a gate insulating film can have excellent characteristics, and the polysilicon depletion ratio (PDR), Fermi-level pinning and resistance characteristics of the gate electrodes can be improved. Thus, a transistor capable of operating at a high speed can be formed.

Moreover, in order to control threshold voltage so as to be able to achieve low voltage and low power, a carbon-containing tungsten and a carbon-containing tungsten nitride are used for a double metal gate electrode structure having a work function suitable for each transistor, thereby obtaining excellent memory operating characteristics.

The foregoing description of implementations provides illustration and description, but is not intended to be exhaustive or to limit the invention to the precise form disclosed. Modifications and variations are possible in light of the above teachings or may be acquired from practice of the invention.

Even though particular combinations of features are recited in the claims or disclosed in the specification, these combinations are not intended to limit the disclosure of the invention. In fact, many of these features may be combined in ways not specifically recited in the claims or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term one or similar language is used. Further, the phrase "based on" is intended to mean "based, at least in part, on" unless explicitly stated otherwise.

What is claimed is:

1. A semiconductor device comprising:
   a substrate including an NMOS region and a PMOS region;
   a first gate electrode formed in the NMOS region, wherein the first gate electrode is substantially consisting of a stack of a carbon-containing tungsten film and a tungsten film; and
   a second gate electrode formed in the PMOS region, wherein the second gate electrode comprises a stack of a carbon-containing tungsten nitride film and a tungsten film,
   wherein the carbon-containing tungsten film includes a fluorine-free tungsten containing carbon and has a low work function,
   wherein a carbon content of the carbon-containing tungsten nitride film is less than a carbon content of the carbon-containing tungsten film.

2. The semiconductor device of claim 1, wherein the tungsten film comprises a stack of a tungsten nucleation film and a bulk tungsten film.

3. The semiconductor device of claim 2, wherein the bulk tungsten film is an alpha-tungsten phase bulk tungsten film.

4. The semiconductor device of claim 1, wherein the carbon-containing tungsten film of the first gate electrode has a carbon content of about 10-15 at %.

5. The semiconductor device of claim 1, wherein the carbon-containing tungsten nitride film of the second gate electrode has a carbon content of about 5-10 at % and a nitrogen content of about 20-30 at %, and the carbon-containing tungsten nitride includes a fluorine-free tungsten nitride containing carbon.

\* \* \* \* \*